(12) United States Patent
Kimura et al.

(10) Patent No.: US 12,170,416 B2
(45) Date of Patent: Dec. 17, 2024

(54) CONNECTING METHOD FOR ELECTRICALLY CONNECTING CONTACT TO FLEXIBLE CONDUCTOR OF CONNECTION OBJECT AND CONNECTOR ASSEMBLY HAVING CONTACT ELECTRICALLY CONNECTED TO FLEXIBLE CONDUCTOR OF CONNECTION OBJECT

(71) Applicant: Japan Aviation Electronics Industry, Limited, Tokyo (JP)

(72) Inventors: Akira Kimura, Tokyo (JP); Seiya Matsuo, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 337 days.

(21) Appl. No.: 17/702,640

(22) Filed: Mar. 23, 2022

(65) Prior Publication Data

US 2022/0344844 A1   Oct. 27, 2022

(30) Foreign Application Priority Data

Apr. 26, 2021   (JP) ................................. 2021-074130

(51) Int. Cl.
*H01R 12/65* (2011.01)
*H01R 13/40* (2006.01)
*H01R 13/502* (2006.01)
*H01R 13/629* (2006.01)
*H01R 13/639* (2006.01)

(52) U.S. Cl.
CPC ............. *H01R 12/65* (2013.01); *H01R 13/40* (2013.01); *H01R 13/502* (2013.01); *H01R 13/629* (2013.01); *H01R 13/639* (2013.01)

(58) Field of Classification Search
None
See application file for complete search history.

(56) References Cited

U.S. PATENT DOCUMENTS

| | | | |
|---|---|---|---|
| 10,868,380 B1* | 12/2020 | Komoto | H01R 12/771 |
| 10,923,855 B2* | 2/2021 | Matsuo | H01R 12/771 |
| 2014/0027170 A1 | 1/2014 | Shimadu et al. | |
| 2018/0233854 A1* | 8/2018 | Komoto | H01R 12/69 |
| 2018/0269606 A1* | 9/2018 | Nakamura | H01R 12/68 |

(Continued)

FOREIGN PATENT DOCUMENTS

| | | |
|---|---|---|
| EP | 2093840 A1 | 8/2009 |
| EP | 3361575 A1 | 8/2018 |

(Continued)

*Primary Examiner* — Oscar C Jimenez

(74) *Attorney, Agent, or Firm* — Muncy, Geissler, Olds & Lowe, P.C.

(57) ABSTRACT

In a connecting method, when a flexible conductor is exposed on a top surface of a connection object, a contact is disposed on the top surface of the connection object at the predetermined position in a state where the connection object is kept as it is, and when the flexible conductor is exposed on a bottom surface of the connection object, the contact is disposed on the top surface of the connection object at the predetermined position in a state where a part of the connection object where the connection part is disposed is inverted such that the connection part faces a top surface side of the connection object while being retained at the predetermined position.

10 Claims, 11 Drawing Sheets

(56) References Cited

U.S. PATENT DOCUMENTS

| | | |
|---|---|---|
| 2019/0148901 A1 | 5/2019 | Komoto |
| 2021/0075146 A1* | 3/2021 | Matsuo .............. H01R 13/5025 |
| 2022/0158373 A1* | 5/2022 | Komoto ............... H01R 13/502 |
| 2022/0302617 A1* | 9/2022 | Komoto ............ H01R 13/4223 |
| 2024/0030645 A1* | 1/2024 | Komoto ................. A41D 1/005 |
| 2024/0088586 A1* | 3/2024 | Hashiguchi .......... H01R 12/774 |

FOREIGN PATENT DOCUMENTS

| | | |
|---|---|---|
| EP | 3483989 A1 | 5/2019 |
| JP | 2014-220380 A | 11/2014 |
| JP | 201987515 A | 6/2019 |

* cited by examiner

CONNECTING METHOD FOR ELECTRICALLY CONNECTING CONTACT TO FLEXIBLE CONDUCTOR OF CONNECTION OBJECT AND CONNECTOR ASSEMBLY HAVING CONTACT ELECTRICALLY CONNECTED TO FLEXIBLE CONDUCTOR OF CONNECTION OBJECT

BACKGROUND OF THE INVENTION

The present invention relates to a connecting method, particularly to a connecting method for electrically connecting a contact having conductivity to a flexible conductor exposed on one of surfaces of a connection object.

The present invention also relates to a connector assembly in which a contact having conductivity is electrically connected to a flexible conductor exposed on one of surfaces of a connection object.

As a connector attached to a connection object having a flexible conductor, for instance, JP 2019-87515 A discloses a connector 1 shown in FIG. 26. The connector 1 has a structure in which a connection object 4 is sandwiched and held between a first insulating member 2 of flat plate shape and a second insulating member 3 of frame shape having an opening 3A in its center.

In the first insulating member 2, there are formed convex portions 2A projecting in the opening 3A of the second insulating member 3 and projections 2B projecting toward the second insulating member 3 at positions closer to the lateral edge portions of the first insulating member 2 than the convex portions 2A are. Contacts 5 are retained by the first insulating member 2 to be exposed on surfaces of the convex portions 2A and the projections 2B. Projection accommodating portions 3B of recess shape for accommodating the projections 2B of the first insulating member 2 are formed at the surface of the second insulating member 3 that faces the first insulating member 2.

The connection object 4 has a flexible conductor 6 exposed on the bottom surface of the connection object 4, i.e., the surface facing the first insulating member 2. When the first insulating member 2 and the second insulating member 3 are pushed to approach each other in the state where the connection object 4 is disposed between the first and second insulating members 2 and 3, as shown in FIG. 27, the connection object 4 is inserted into the projection accommodating portion 3B of the second insulating member 3 by the projection 2B of the first insulating member 2. Consequently, the connection object 4 is sandwiched between the inner surface of the projection accommodating portion 3B and a part of the contact 5 disposed on the surface of the projection 2B of the first insulating member 2, so that the contact 5 is electrically connected to the flexible conductor 6 exposed on the bottom surface of the connection object 4.

Meanwhile, another part of the contact 5 that is situated on the surface of the convex portion 2A of the first insulating member 2 makes contact with and is electrically connected to the corresponding contact of a counter connector when a part of the counter connector is inserted into the opening 3A of the second insulating member 3 and the counter connector is fitted to the connector 1.

Thus, the use of the connector 1 of JP 2019-87515 A makes it possible to electrically connect the contact 5 to the flexible conductor 6 exposed on the bottom surface of the connection object 4.

However, since the bottom surface of the connection object 4 makes contact with the contact 5 in the projection accommodating portion 3B of the second insulating member 3, in the case where the flexible conductor 6 is exposed not on the bottom surface but only on the top surface of the connection object 4, the contact 5 cannot be electrically connected to the flexible conductor 6.

SUMMARY OF THE INVENTION

The present invention has been made to solve the foregoing problem and aims at providing a connecting method that enables to make an electrical connection of a contact to a flexible conductor of a connection object regardless of whether the flexible conductor is exposed on the top surface or the bottom surface of the connection object.

The present invention also aims at providing a connector assembly in which a contact is electrically connected to a flexible conductor of a connection object using a connector to be attached to the connection object.

A connecting method according to the present invention is one for electrically connecting a contact having conductivity to a flexible conductor exposed on one of surfaces of a connection object, the flexible conductor including a connection part that is formed of part of the flexible conductor and situated at a predetermined position when viewed from a direction perpendicular to the connection object, the method comprising the steps of:
when the flexible conductor is exposed on a top surface of the connection object, disposing the contact on the top surface of the connection object at the predetermined position in a state where the connection object is kept as it is, and when the flexible conductor is exposed on a bottom surface of the connection object, disposing the contact on the top surface of the connection object at the predetermined position in a state where a part of the connection object where the connection part is disposed is inverted such that the connection part faces a top surface side of the connection object while being retained at the predetermined position, and
retaining the contact in a housing that is attached to the connection object and bringing the contact into contact with the connection part to electrically connect the contact to the flexible conductor.

A connector assembly according to the present invention comprises:
a connection object having a flexible conductor exposed on one of surfaces of the connection object; and
a connector that is attached to the connection object,
wherein the connector includes
a contact that is disposed on a top surface of the connection object and has conductivity, and
a housing that is attached to the connection object and retains the contact,
wherein the flexible conductor includes a connection part that is formed of part of the flexible conductor and situated at a predetermined position when viewed from a direction perpendicular to the connection object,
wherein when the flexible conductor is exposed on a top surface of the connection object, the contact is disposed on the top surface of the connection object at the predetermined position in a state where the connection object is kept as it is, and when the flexible conductor is exposed on a bottom surface of the connection object, the contact is disposed on the top surface of the connection object at the predetermined position in a state where a part of the connection object where the connection part is disposed is inverted such that the connection part faces a top surface side of the connection object while being retained at the predetermined position, and wherein the contact retained in the housing makes contact with the connection object, whereby the contact is electrically connected to the flexible conductor.

DETAILED DESCRIPTION OF THE INVENTION

Embodiments of the present invention is described below with reference to the accompanying drawings.

Embodiment 1

Figure 1:
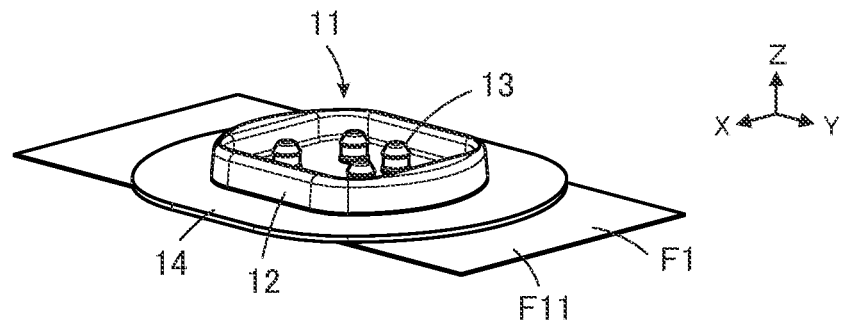
FIG. 1 is a perspective view of a connector assembly according to Embodiment 1 in which a connector is attached to a connection object having a flexible conductor exposed on a bottom surface of the connection object, as viewed from an obliquely upper position.
Figure 2:
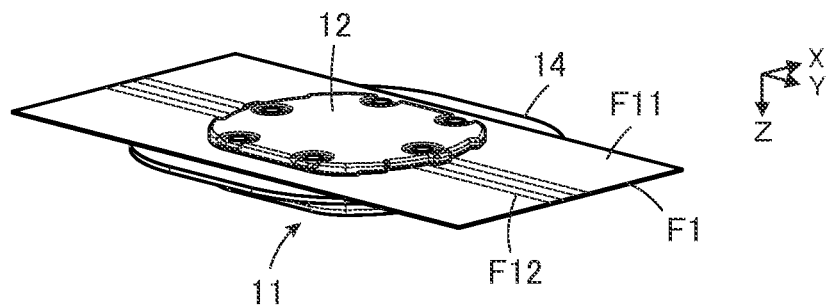
FIG. 2 is a perspective view of the connector assembly according to Embodiment 1 in which the connector is attached to the connection object having the flexible conductor exposed on the bottom surface of the connection object, as viewed from an obliquely lower position.

FIGS. 1 and 2 show a connector assembly according to Embodiment 1. The connector assembly is obtained by attaching a connector 11 to a sheet-like connection object F1.

The connector 11 is used as, for example, a garment-side connector portion for fitting a wearable device, and has a housing 12. In the housing 12, four contacts 13 are retained to project perpendicularly to the connection object F1 in two lines parallel to each other.

The connector 11 is attached to the connection object F1 together with a reinforcement sheet 14 for reinforcing the connection object F1.

In the connection object F1, for example, wirings constituted of a flexible conductor F12 are exposed on a bottom surface of a sheet-like support F11 made of an insulating resin material and having flexibility. The flexible conductor F12 is not exposed on a top surface of the support F11. For the connection object F1, applicable examples include a so-called smart textile provided, on at least one surface thereof, with wirings formed by weaving conductive fibers into the textile, printing conductive ink, or other method.

For convenience, the connection object F1 is defined as extending along an XY plane, the direction in which two lines of the four contacts 13 are aligned is referred to as "Y direction," and the direction in which the four contacts 13 project is referred to as "+Z direction." The Z direction coincides with a fitting direction in which the connector 11 is fitted to a counter connector (not shown).

Figure 3:
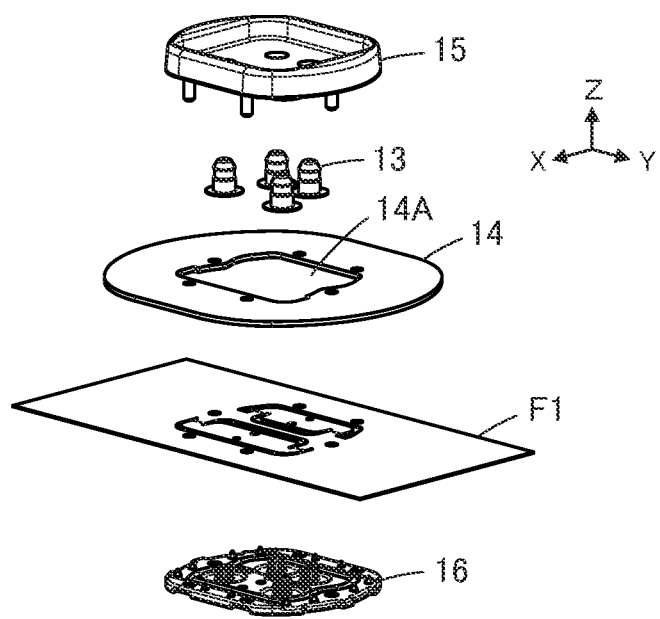
FIG. 3 is an exploded perspective view of the connector assembly according to Embodiment 1.

FIG. 3 is an exploded perspective view of the connector assembly. The connector 11 includes a top insulator 15 and a bottom insulator 16 that are made of an insulating material such as an insulating resin, and these top and bottom insulators 15 and 16 constitute the housing 12.

The four contacts 13 are disposed on a top surface of the connection object F1 through an opening portion 14A formed in the reinforcement sheet 14, and the connection object F1 is sandwiched in the Z direction between the top insulator 15 disposed on a top surface side of the connection object F1 and the bottom insulator 16 disposed on a bottom surface side of the connection object F1, whereby the four contacts 13 and the reinforcement sheet 14 are retained in the housing 12.

Figure 4:
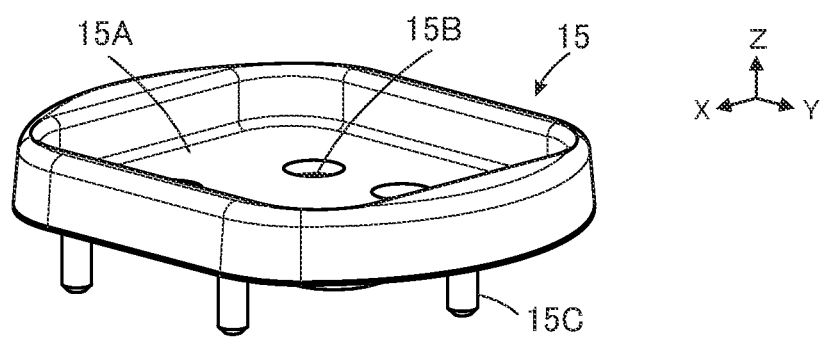
FIG. 4 is a perspective view of a top insulator used in the connector assembly according to Embodiment 1, as viewed from an obliquely upper position.
Figure 5:
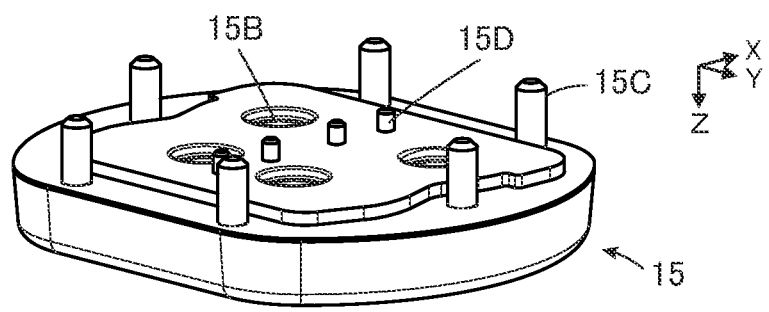
FIG. 5 is a perspective view of the top insulator used in the connector assembly according to Embodiment 1, as viewed from an obliquely lower position.

As shown in FIGS. 4 and 5, the top insulator 15 includes a recessed portion 15A opening in the +Z direction and is provided with four contact through-holes 15B within the recessed portion 15A. The four contact through-holes 15B separately correspond to the four contacts 13.

On a surface of the top insulator 15 facing in the −Z direction, a plurality of fixing posts 15C of columnar shape are formed to project in the −Z direction at outward positions with respect to the four contact through-holes 15B. The plurality of fixing posts 15C are provided to fix the bottom insulator 16 to the top insulator 15 when the connector 11 is attached to the connection object F1.

On the surface of the top insulator 15 facing in the −Z direction, four positioning pins 15D of columnar shape are also formed to project in the −Z direction at positions between the four contact through-holes 15B. These positioning pins 15D are provided to position the connection object F1 with respect to the top insulator 15, and are smaller in height than the fixing posts 15C.

Figure 6:
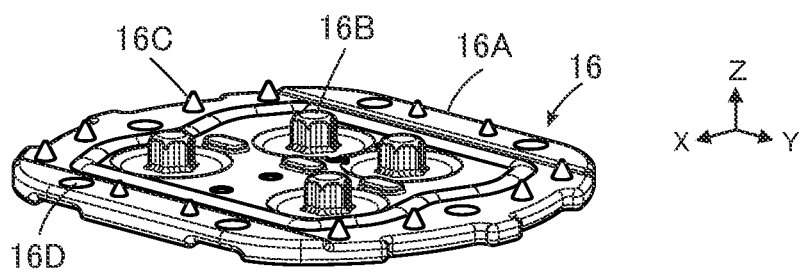
FIG. 6 is a perspective view of a bottom insulator used in the connector assembly according to Embodiment 1, as viewed from an obliquely upper position.
Figure 7:
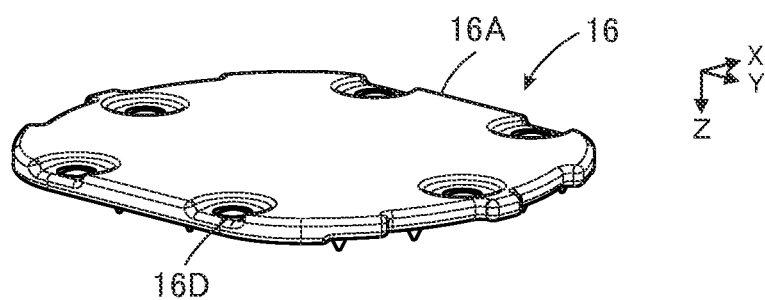
FIG. 7 is a perspective view of the bottom insulator used in the connector assembly according to Embodiment 1, as viewed from an obliquely lower position.

As shown in FIGS. 6 and 7, the bottom insulator 16 includes a flat plate portion 16A extending along an XY plane, and on a surface of the flat plate portion 16A facing in the +Z direction, four projections 16B are formed to project in the +Z direction. The four projections 16B separately correspond to the four contacts 13.

On the surface of the flat plate portion 16A facing in the +Z direction, a plurality of positional shift prevention pins 16C are also formed to project in the +Z direction at outward positions with respect to the four projections 16B. These positional shift prevention pins 16C each have a conical shape and are provided to fix positions of the connection object F1 and the reinforcement sheet 14 when the connector 11 is attached to the connection object F1.

Moreover, in the flat plate portion 16A, a plurality of through-holes 16D penetrating the flat plate portion 16A in the Z direction are formed at outward positions with respect to the four projections 16B. The plurality of through-holes 16D separately correspond to the plurality of fixing posts 15C of the top insulator 15.

Figure 8:
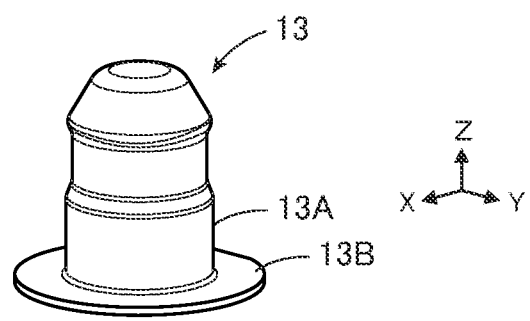
FIG. 8 is a perspective view of a contact used in the connector assembly according to Embodiment 1, as viewed from an obliquely upper position.
Figure 9:
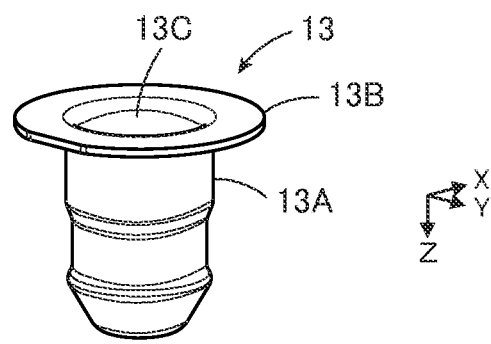
FIG. 9 is a perspective view of the contact used in the connector assembly according to Embodiment 1, as viewed from an obliquely lower position.

As shown in FIGS. 8 and 9, the contact 13 is a plug-type contact made of a conductive material such as metal and includes a tubular portion 13A of cylindrical shape that extends in the +Z direction and a flange 13B that is formed integrally with the −Z directional end of the tubular portion 13A and extends out of the tubular portion 13A along an XY plane.

The tubular portion 13A of the contact 13 has an outside diameter smaller than an inside diameter of the contact through-hole 15B of the top insulator 15, and the flange 13B of the contact 13 has an outside diameter larger than the inside diameter of the contact through-hole 15B of the top insulator 15.

The tubular portion 13A is provided in its interior with a recessed portion 13C opening toward the −Z direction. The recessed portion 13C has an inside diameter slightly smaller than a value obtained by adding a double of a sum of a thickness of the support F11 of the connection object F1 and a thickness of the flexible conductor F12 to an outside diameter of the projection 16B of the bottom insulator 16. The contact 13 as above can be manufactured by, for example, performing press working, cutting, drawing or other processing on a metal material.

Figure 10:
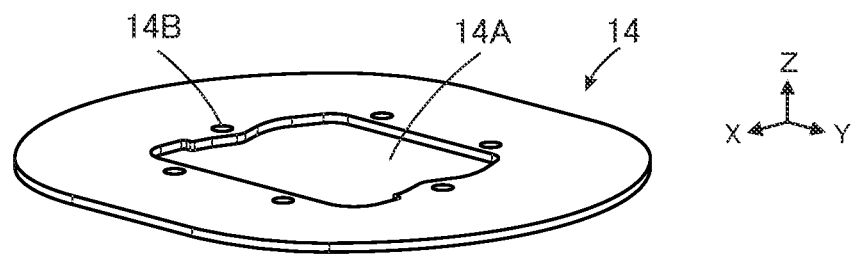
FIG. 10 is a perspective view of a reinforcement sheet used in the connector assembly according to Embodiment 1, as viewed from an obliquely upper position.

As shown in FIG. 10, the reinforcement sheet 14 has the opening portion 14A that is formed in a central part of the reinforcement sheet 14 and penetrates the reinforcement sheet 14, and a plurality of through-holes 14B penetrating the reinforcement sheet 14 are formed around the opening portion 14A. The plurality of through-holes 14B separately correspond to the plurality of fixing posts 15C of the top insulator 15.

The reinforcement sheet 14 as above is formed of, for example, a resin having excellent stretchability such as polyurethane.

Figure 11:
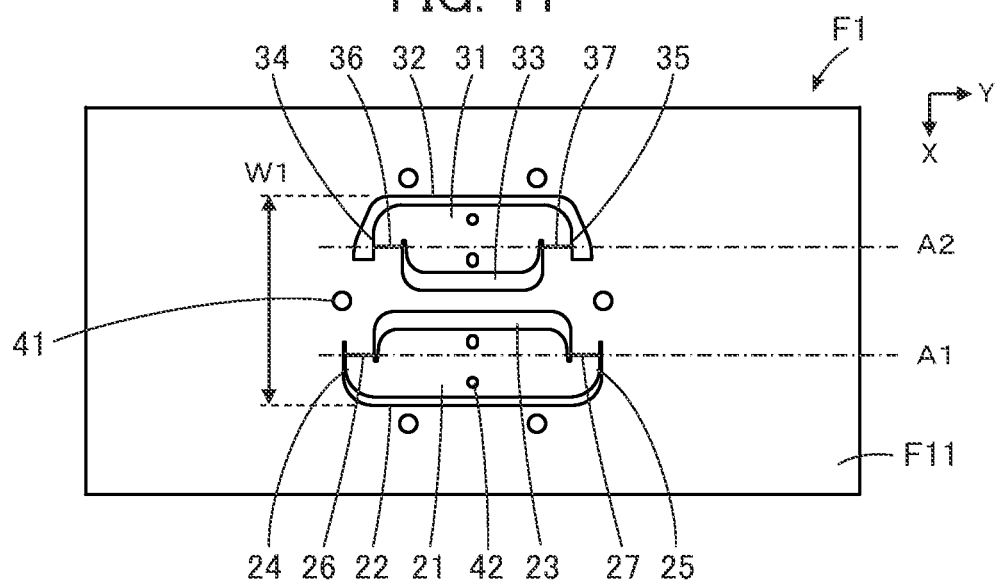
FIG. 11 is a plan view showing a top surface of the connection object used in the connector assembly according to Embodiment 1.

As shown in FIG. 11, the sheet-like support F11 of the connection object F1 is provided with a first island-like portion 21 and a second island-like portion 31 that are arranged adjacent to each other in the X direction.

The first island-like portion 21 is surrounded by a pair of cuts 22 and 23 facing each other in the X direction, and opposite ends in the Y direction of the first island-like portion 21 are joined to a surrounding portion of the support F11 via a pair of joint portions 24 and 25, respectively.

The joint portions 24 and 25 extend in the X direction, and folding-back lines 26 and 27 extending in the Y direction are set at middle parts of the joint portions 24 and 25 in the X direction, respectively. These folding-back lines 26 and 27 are situated in the same position in the X direction and on a straight line extending in the Y direction.

The first island-like portion 21 is situated on an inversion axis A1 passing the folding-back lines 26 and 27 and extending in the Y direction, and by folding back the pair of joint portions 24 and 25 at the folding-back lines 26 and 27, respectively, the first island-like portion 21 can be inverted by 180° around the inversion axis A1.

Similarly, the second island-like portion 31 is surrounded by a pair of cuts 32 and 33 facing each other in the X direction, and opposite ends in the Y direction of the second island-like portion 31 are joined to a surrounding portion of the support F11 via a pair of joint portions 34 and 35, respectively.

The joint portions 34 and 35 extend in the X direction, and folding-back lines 36 and 37 extending in the Y direction are set at middle parts of the joint portions 34 and 35 in the X direction, respectively. These folding-back lines 36 and 37 are situated in the same position in the X direction and on a straight line extending in the Y direction.

The second island-like portion 31 is situated on an inversion axis A2 passing the folding-back lines 36 and 37 and extending in the Y direction, and by folding back the pair of joint portions 34 and 35 at the folding-back lines 36 and 37, respectively, the second island-like portion 31 can be inverted by 180° around the inversion axis A2.

The support F11 of the connection object F1 is provided with a plurality of through-holes 41 that are disposed around the first island-like portion 21 and the second island-like portion 31 so as to surround the first island-like portion 21 and the second island-like portion 31. The plurality of through-holes 41 separately correspond to the plurality of fixing posts 15C of the top insulator 15.

Two through-holes 42 arranged in the X direction are formed at a middle part of the first island-like portion 21 in the Y direction, and similarly, two through-holes 42 arranged in the X direction are formed at a middle part of the second island-like portion 31 in the Y direction. These through-holes 42 separately correspond to the four positioning pins 15D of the top insulator 15.

Figure 12:
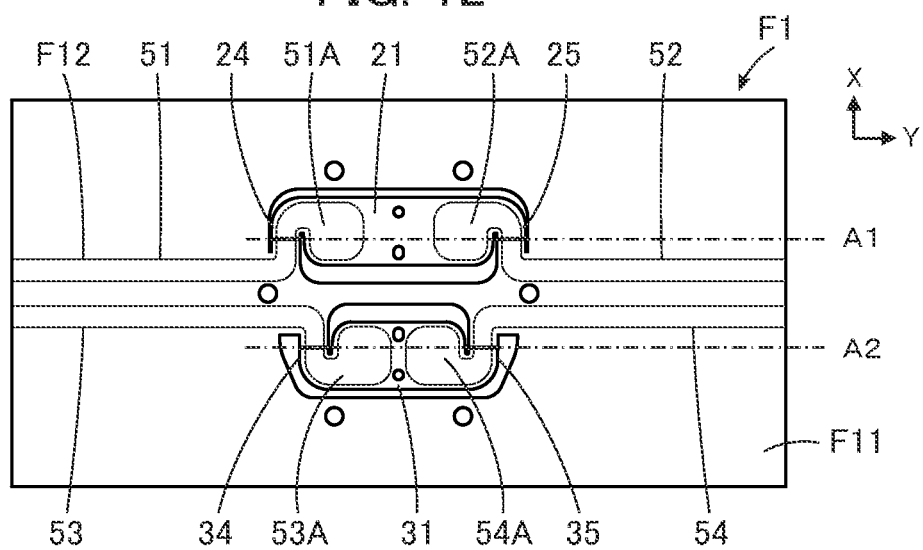
FIG. 12 is a bottom view showing a bottom surface of the connection object used in the connector assembly according to Embodiment 1.

As shown in FIG. 12, four wirings 51 to 54 constituted of the flexible conductor F12 are exposed on the bottom surface of the support F11 facing in the −Z direction. These wirings 51 to 54 extend in the Y direction.

In the first island-like portion 21, a connection part 51A formed of part of the flexible conductor F12 and connected to an end portion of the wiring 51 and a connection part 52A formed of part of the flexible conductor F12 and connected to an end portion of the wiring 52 are arranged side by side in the Y direction on and along the inversion axis A1. The wiring 51 extends in the +Y direction from the −Y direction on the bottom surface of the support F11, reaches the first island-like portion 21 through the joint portion 24 and is connected to the connection part 51A. Similarly, the wiring 52 extends in the −Y direction from the +Y direction on the bottom surface of the support F11, reaches the first island-like portion 21 through the joint portion 25 and is connected to the connection part 52A.

In the second island-like portion 31, a connection part 53A formed of part of the flexible conductor F12 and connected to an end portion of the wiring 53 and a connection part 54A formed of part of the flexible conductor F12 and connected to an end portion of the wiring 54 are arranged side by side in the Y direction on and along the inversion axis A2. The wiring 53 extends in the +Y direction from the −Y direction on the bottom surface of the support F11, reaches the second island-like portion 31 through the joint portion 34 and is connected to the connection part 53A. Similarly, the wiring 54 extends in the −Y direction from the +Y direction on the bottom surface of the support F11, reaches the second island-like portion 31 through the joint portion 35 and is connected to the connection part 54A.

Figure 13:
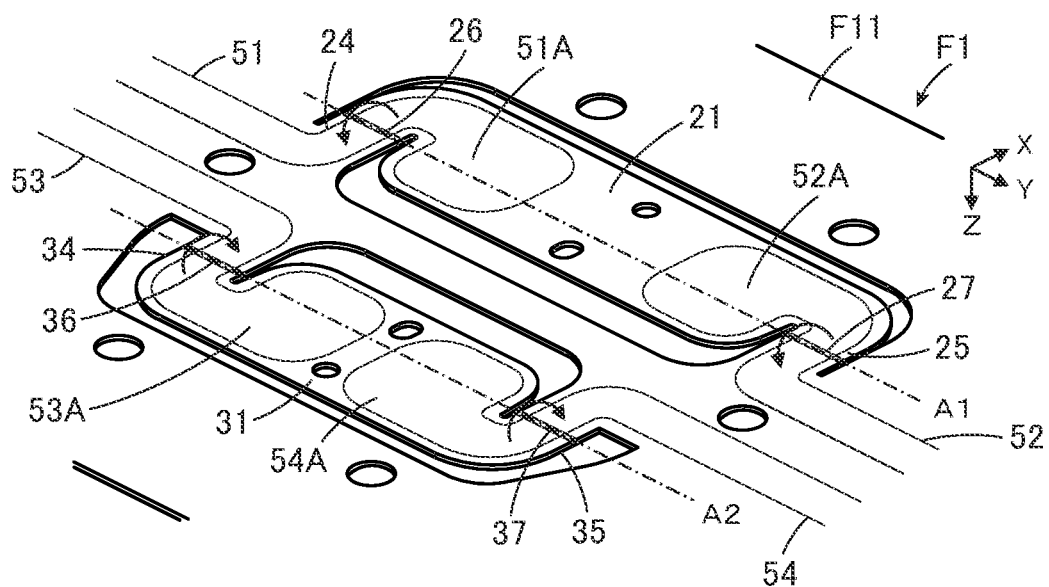
FIG. 13 is an enlarged perspective view showing a main part of the bottom surface of the connection object used in the connector assembly according to Embodiment 1.

With this configuration, as shown in FIG. 13, the pair of joint portions 24 and 25 are respectively folded back at the folding-back lines 26 and 27 such that the wirings 51 and 52 are located inside and the support F11 is located outside, whereby the first island-like portion 21 provided with the connection parts 51A and 52A is inverted by 180° around the inversion axis A1.

Similarly, the pair of joint portions 34 and 35 are respectively folded back at the folding-back lines 36 and 37 such that the wirings 53 and 54 are located inside and the support F11 is located outside, whereby the second island-like portion 31 provided with the connection parts 53A and 54A is inverted by 180° around the inversion axis A2.

Figure 14:
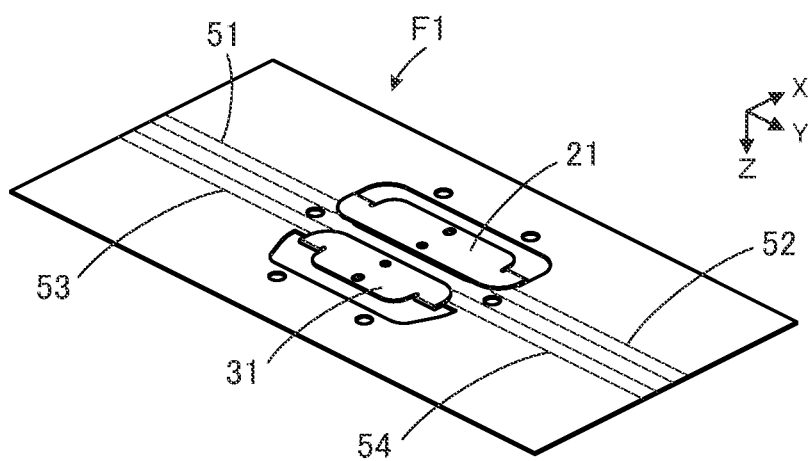
FIG. 14 is a perspective view showing the bottom surface of the connection object in a state where island-like portions are inverted in Embodiment 1.
Figure 15:
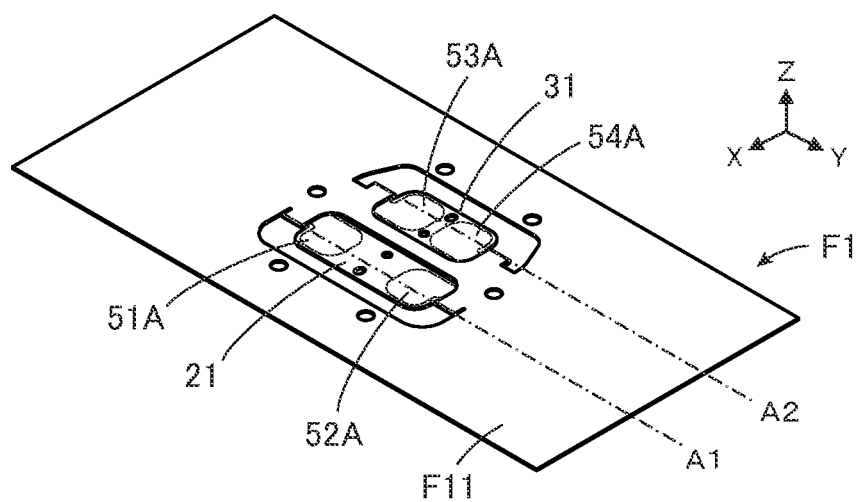
FIG. 15 is a perspective view showing the top surface of the connection object in the state where the island-like portions are inverted in Embodiment 1.

As a result, as shown in FIGS. 14 and 15, the connection parts 51A and 52A of the first island-like portion 21 and the connection parts 53A and 54A of the second island-like portion 31 cannot be seen from the −Z direction side and face in the +Z direction.

Note that the first island-like portion 21 and the second island-like portion 31 are disposed such that, when the first island-like portion 21 and the second island-like portion 31 are respectively inverted by 180° around the inversion axes A1 and A2, they do not go over the cuts 22, 23, 32, 33 and do not overlap a surrounding portion of the support 11.

The connection parts 51A and 52A of the first island-like portion 21 are disposed on the inversion axis A1, and while there is a difference as to whether the connection parts 51A and 52A face the bottom surface side or the top surface side of the connection object F1 before and after the first island-like portion 21 is inverted by 180° around the inversion axis A1, when viewed in the Z direction perpendicular to the connection object F1, the connection parts 51A and 52A are retained at substantially the same predetermined positions with respect to the connection object F1.

Similarly, the connection parts 53A and 54A of the second island-like portion 31 are disposed on the inversion axis A2, and while there is a difference as to whether the connection parts 53A and 54A face the bottom surface side or the top surface side of the connection object F1 before and after the second island-like portion 31 is inverted by 180° around the inversion axis A2, when viewed in the Z direction perpendicular to the connection object F1, the connection parts 53A and 54A are retained at substantially the same predetermined positions with respect to the connection object F1.

Described below is a method in which the connector assembly is assembled by attaching the connector 11 to the connection object F1 having the flexible conductor F12 exposed on the bottom surface of the connection object F1 facing the −Z direction.

First, as shown in FIG. 13, the pair of joint portions 24 and 25 are respectively folded back at the folding-back lines 26 and 27 so that the first island-like portion 21 provided with the connection parts 51A and 52A is inverted by 180° around the inversion axis A1, and the pair of joint portions 34 and 35 are respectively folded back at the folding-back lines 36 and 37 so that the second island-like portion 31 provided with the connection parts 53A and 54A is inverted by 180° around the inversion axis A2. Therefore, the connection parts 51A and 52A of the first island-like portion 21 and the connection parts 53A and 54A of the second island-like portion 31 that have faced in the −Z direction are to face in the +Z direction as shown in FIG. 15.

Figure 16:
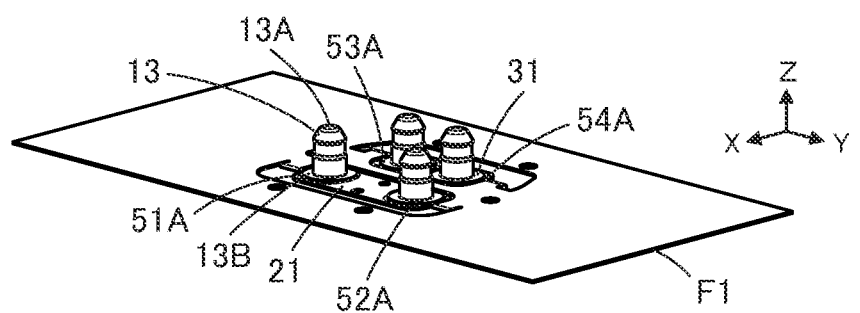
FIG. 16 is a perspective view showing a state where the contacts are separately disposed on connection parts facing a top surface side of the connection object.

In this state, as shown in FIG. 16, the contacts 13 are separately disposed on the connection parts 51A, 52A, 53A and 54A facing in the +Z direction. Of each contact 13, the flange 13B is in contact with the corresponding connection part 51A, 52A, 53A or 54A, and the tubular portion 13A extends in the +Z direction.

Next, the reinforcement sheet 14 is disposed on the top surface of the connection object F1 such that the four contacts 13 separately disposed on the connection parts 51A, 52A, 53A and 54A are situated in the opening portion 14A of the reinforcement sheet 14, and further, the top insulator 15 is disposed on the +Z direction side of the reinforcement sheet 14.

At this time, the tubular portions 13A of the four contacts 13 are separately inserted into the four contact through-holes 15B of the top insulator 15 shown in FIG. 4 and project in the recessed portion 15A of the top insulator 15.

Figure 17:
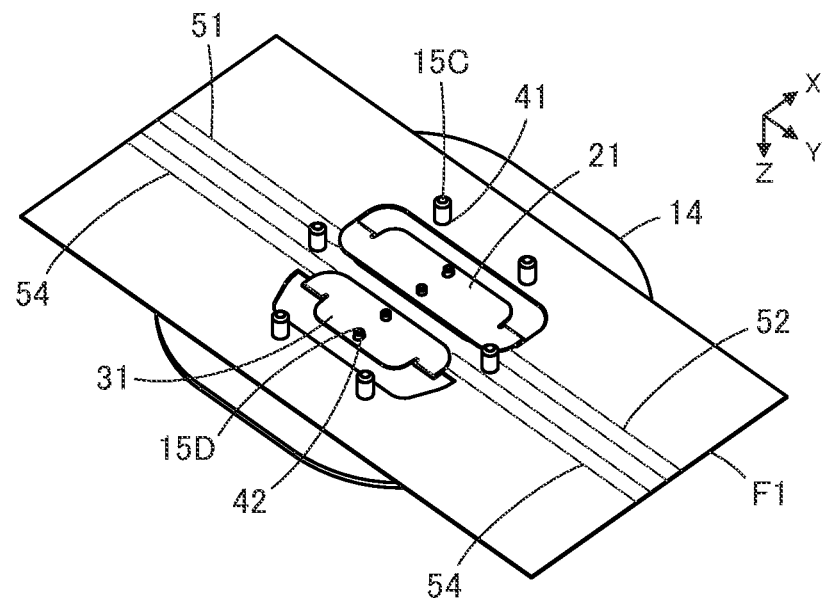
FIG. 17 is a perspective view showing the bottom surface of the connection object in a state where the reinforcement sheet and the top insulator are disposed on the top surface side.

The plurality of fixing posts 15C of the top insulator 15 separately pass through the plurality of through-holes 14B of the reinforcement sheet 14 and the plurality of through-holes 41 of the connection object F1, and as shown in FIG. 17, project in the −Z direction from the bottom surface of the connection object F1 facing in the −Z direction. Thus, the top insulator 15 and the reinforcement sheet 14 are positioned in the X and Y directions with respect to the connection object F1.

Further, the four positioning pins 15D of the top insulator 15 separately pass through the two through-holes 42 of the first island-like portion 21 and the two through-holes 42 of the second island-like portion 31 of the connection object F1. Thus, the first island-like portion 21 and the second island-like portion 31 that are respectively inverted by 180° around the inversion axes A1 and A2 are positioned with respect to the top insulator 15 and the four contacts 13.

Figure 18:
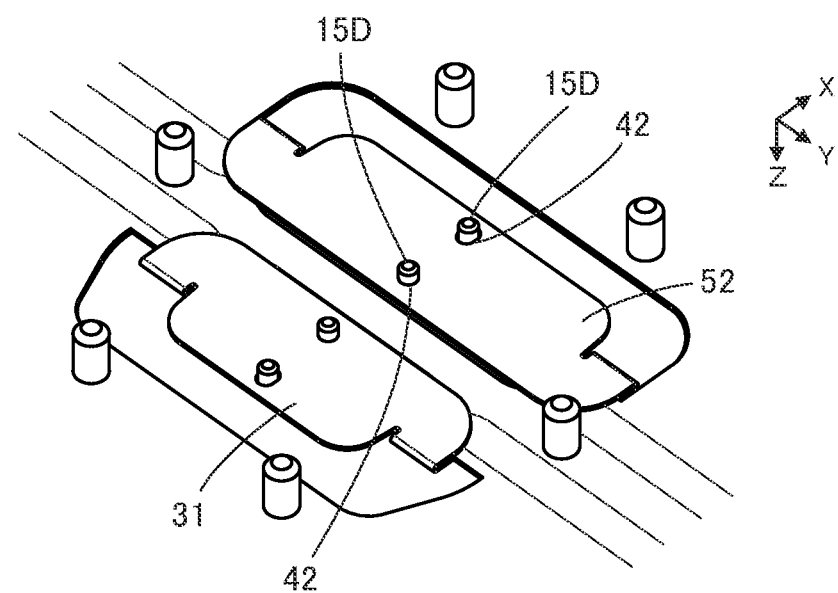
FIG. 18 is an enlarged view of a main part of FIG. 17.

As shown in FIG. 18, when one through-hole 42 of the two through-holes 42 of the first island-like portion 21 is formed to have a circular shape having a diameter corresponding to an outside diameter of the positioning pin 15D of the top insulator 15 and the other through-hole 42 is formed to have an oval shape having a minor diameter corresponding to the outside diameter of the positioning pin 15D of the top insulator 15, production tolerances of the top insulator 15 and the connection object F1 and an assembling tolerance in inverting the first island-like portion 21 are absorbed, whereby positioning of the first island-like portion 21 can be performed.

The same applies to the two through-holes 42 of the second island-like portion 31.

Thereafter, the bottom insulator 16 is moved from the −Z direction toward the +Z direction, and assembling of the bottom insulator 16 to the top insulator 15 starts.

At this time, the plurality of fixing posts 15C, which project from the connection object F1 in the −Z direction, of the top insulator 15 are separately passed through the plurality of through-holes 16D of the bottom insulator 16, whereby the bottom insulator 16 is positioned in the X and Y directions with respect to the top insulator 15.

When the top insulator 15 and the bottom insulator 16 are pressed against each other in the Z direction to approach each other in this state, the four projections 16B of the bottom insulator 16 comes into contact with the bottom surface of the connection object F1 facing in the −Z direction and subsequently push the contacted portions of the connection object F1 in the +Z direction.

Figure 19:
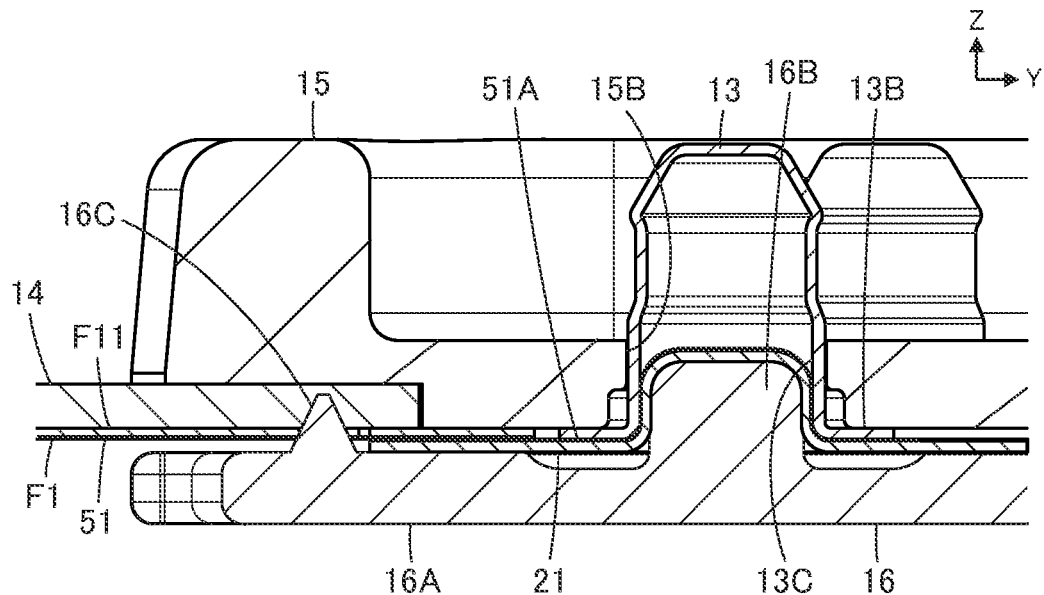
FIG. 19 is a partial enlarged cross-sectional view showing a main part of the connector assembly according to Embodiment 1.

As a result, as shown in FIG. 19, the projection 16B of the bottom insulator 16B is inserted into the recessed portion 13C of the corresponding contact 13 with the connection object F1 being sandwiched therebetween. Consequently, the first island-like portion 21 of the connection object F1 and the connection part 51A exposed on the surface on the +Z direction side of the first island-like portion 21 are pushed in the +Z direction toward the recessed portion 13C by the projection 16B and thereby deform, whereupon an inner peripheral surface of the recessed portion 13C of the contact 13 makes contact with the connection part 51A in the direction along an XY plane.

Here, since the first island-like portion 21 and the connection part 51A are respectively formed of part of the support F11 and part of the flexible conductor F12 of the connection object F1, and the recessed portion 13C of the contact 13 has the inside diameter slightly smaller than a value obtained by adding a double of the sum of the thickness of the support F11 and the thickness of the flexible conductor F12 of the connection object F1 to the outside diameter of the projection 16B of the bottom insulator 16, the projection 16B presses the connection part 51A against the inner peripheral surface of the recessed portion 13C of the contact 13 and thus applies contact pressure, so that the contact 13 is electrically connected to the connection part 51A.

Similarly, each of the connection part 52A of the first island-like portion 21 and the connection parts 53A and 54A of the second island-like portion 31 is electrically connected to the corresponding contact 13.

The flange 13B of the contact 13 has the outside diameter larger than the inside diameter of the contact through-hole 15B of the top insulator 15 and is sandwiched between a surface on the −Z direction side of the top insulator 15 and a surface on the +Z direction side of the connection object F1.

While the fixing posts 15C of the top insulator 15 separately pass through the through-holes 16D of the bottom insulator 16 and project on the −Z direction side, −Z directional ends of the fixing posts 15C are heated and deformed, whereby the bottom insulator 16 is fixed to the top insulator 15. As a result, the contact 13 is held in the housing 12 constituted of the top insulator 15 and the bottom insulator 16.

Further, the top insulator 15 and the bottom insulator 16 are pressed against each other in the Z direction to approach each other so that the positioning shift prevention pins 16C each having a conical shape and projecting from the flat plate portion 16A of the bottom insulator 16 in the +Z direction are thrust into the support F11 of the connection object F1 and the reinforcement sheet 14, whereby a shift in position between the connection object F1 and the reinforcement sheet 14 is prevented.

In this manner, as shown in FIGS. 1 and 2, the connector 11 is attached to the connection object F1, and the assembling operation of the connector assembly is thus completed.

Note that, as shown in FIG. 12, the connection parts 51A and 52A of the first island-like portion 21 are disposed on the inversion axis A1 and retained at substantially the same predetermined positions when viewed in the Z direction before and after the first island-like portion 21 is inverted, and similarly, the connection parts 53A and 54A of the second island-like portion 31 are disposed on the inversion axis A2 and retained at substantially the same predetermined positions when viewed in the Z direction before and after the second island-like portion 31 is inverted. In order to form the first island-like portion 21 and the second island-like portion 31 as above, as shown in FIG. 11, the support F11 is punched over a punching width W1 in the X direction to form the cuts 22, 23, 32, 33.

Figure 20:
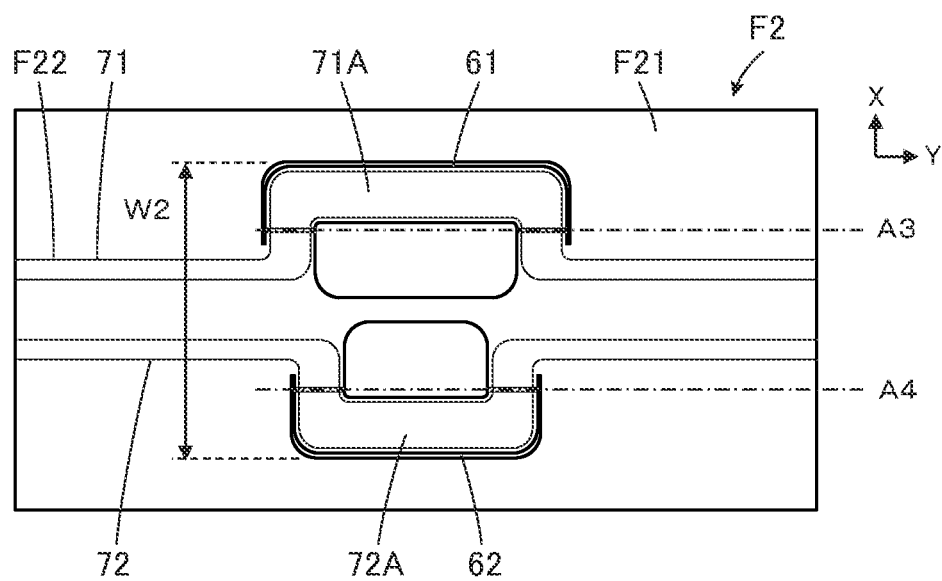
FIG. 20 is a bottom view showing a bottom surface of a connection object as a reference example.

In contrast, the case is assumed where, as in a connection object F2 shown in FIG. 20, a first island-like portion 61 and a second island-like portion 62 are not respectively situated on inversion axes A3 and A4, connection parts 71A and 72A respectively connected to the wirings 71 and 72 constituted of a flexible conductor F22 are respectively disposed on the first island-like portion 61 and the second island-like portion 62, and the first island-like portion 61 and the second island-like portion 62 are respectively inverted by 180° around the inversion axes A3 and A4, whereby the connection parts 71A and 72A are respectively situated at the same predetermined positions as the connection parts 51A and 52A and the connection parts 53A and 54A of the connection object F1 shown in FIG. 15.

In this case, since the first island-like portion 61 and the second island-like portion 62 are respectively situated not on the inversion axes A3 and A4 but at outward positions with respect to the inversion axes A3 and A4, it would be necessary to punch a support F21 of the connection object F2 over a punching width W2 larger than the punching width W1 in the connection object F1.

Since the connection parts 51A and 52A and the connection parts 53A and 54A are respectively disposed on the inversion axes A1 and A2 in the connection object F1 shown in FIGS. 11 and 12, the punching width W1 of the support F1 can be reduced. As a result, the cuts 22, 23 surrounding the first island-like portion 21 and the cuts 32, 33 surrounding the second island-like portion 31 of the connection object F1 are disposed in a region to be sandwiched between the top insulator 15 and the bottom insulator 16, whereby the connector 11 can be decreased in size.

As shown in FIG. 13, the pair of joint portions 24 and 25 are respectively folded back at the folding-back lines 26 and 27 such that the wirings 51 and 52 are located inside and the support F11 is located outside, and similarly, the pair of joint portions 34 and 35 are respectively folded back at the folding-back lines 36 and 37 such that the wirings 53 and 54 are located inside and the support F11 is located outside, but the invention is not limited thereto.

Figure 21:
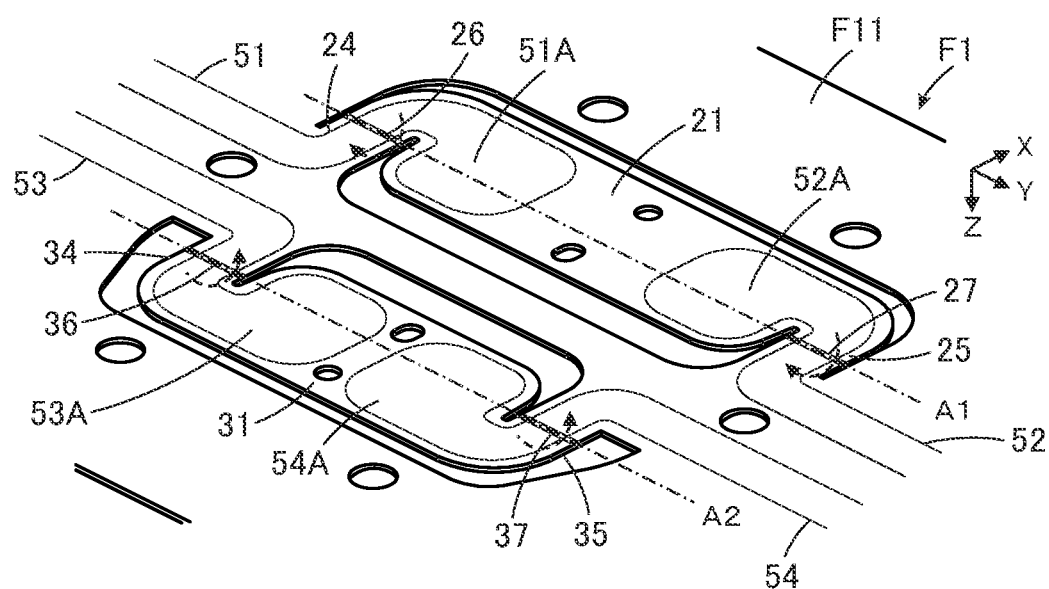
FIG. 21 is an enlarged perspective view showing a main part of a bottom surface of a connection object used in a connector assembly according to a modification of Embodiment 1.

As shown in FIG. 21, even when the pair of joint portions 24 and 25 are respectively folded back at the folding-back lines 26 and 27 such that the wirings 51 and 52 are located outside and the support F11 is located inside and similarly, the pair of joint portions 34 and 35 are respectively folded back at the folding-back lines 36 and 37 such that the wirings 53 and 54 are located outside and the support F11 is located inside, the first island-like portion 21 provided with the connection parts 51A and 52A and the second island-like portion 31 provided with the connection parts 53A and 53B can be inverted by 180° around the inversion axes A1 and A2.

Figure 22:
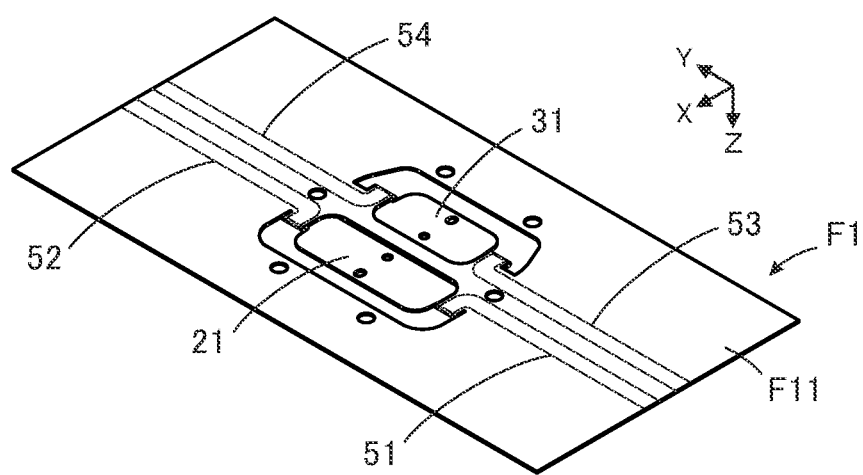
FIG. 22 is a perspective view showing the bottom surface of the connection object in a state where island-like portions are inverted in the modification of Embodiment 1.
Figure 23:
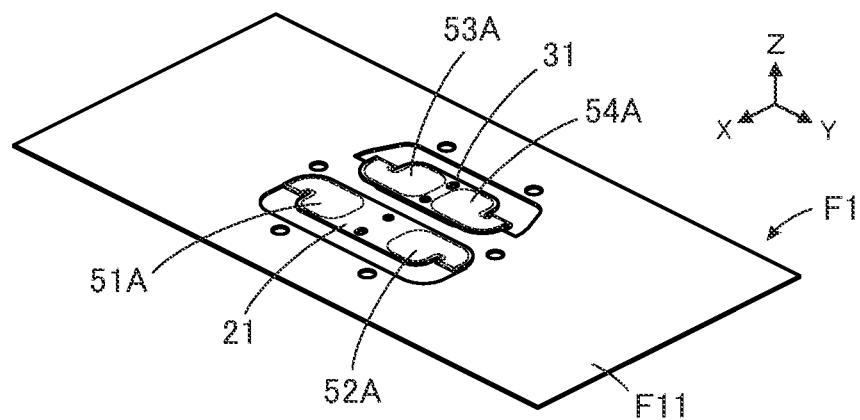
FIG. 23 is a perspective view showing a top surface of the connection object in the state where the island-like portions are inverted in the modification of Embodiment 1.

Even in this manner, as shown in FIGS. 22 and 23, the connection parts 51A and 52A of the first island-like portion 21 and the connection parts 53A and 54A of the second island-like portion 31 cannot be seen from the −Z direction side and face in the +Z direction. Therefore, as with Embodiment 1, the connector assembly can be assembled by attaching the connector 11 to the connection object F11.

Figure 24:
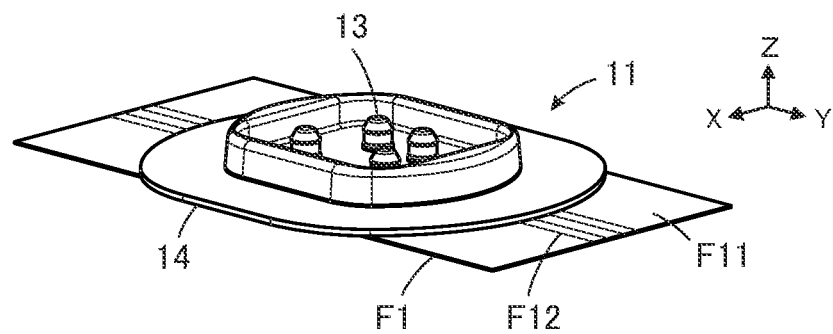
FIG. 24 is a perspective view of the connector assembly according to Embodiment 1 in which the connector is attached to the connection object having the flexible conductor exposed on the top surface of the connection object, as viewed from an obliquely upper position.

While in Embodiment 1 above, the connector 11 is attached to the connection object F1 having the flexible conductor F12 exposed on the bottom surface of the connection object F1 facing in the −Z direction as shown in FIGS. 1 and 2, the connector 11 can be attached also to the connection object F1 in the state where the connection object F1 is turned over so that the flexible conductor F12 is exposed on the front surface of the connection object F1 facing in the +Z direction and the flexible conductor F12 is not exposed on the bottom surface of the connection object F1 facing in the −Z direction as shown in FIG. 24.

In this case, since the connection parts 51A and 52A and the connection parts 53A and 54A disposed in the first island-like portion 21 and the second island-like portion 31 already face in the +Z direction, as shown in FIG. 16, the contacts 13 are respectively disposed on the connection parts 51A, 52A, 53A and 54A while the first island-like portion 21 and the second island-like portion 31 are not inverted by 180° around the inversion axes A1 and A2 and kept as they are. Thus, as with Embodiment 1 above, the reinforcement sheet 14 and the top insulator 15 are disposed on the +Z direction side of the connection object F1, and the bottom insulator 16 is assembled to the top insulator 15 from the −Z direction side of the connection object F1.

Thus, the connector assembly is assembled, and the four contacts 13 are electrically connected to the connection parts 51A, 52A, 53A and 54A, respectively.

As above, according to the connector assembly of Embodiment 1, regardless of whether the flexible conductor F12 is exposed on the bottom surface or the top surface of the connection object F1, only by selecting whether the first island-like portion 21 and the second island-like portion 31 of the connection object F1 are respectively inverted by 180° around the inversion axes A1 and A2 or are not inverted and kept as they are, the connector 11 can be attached to the connection object F1 to electrically connect the contacts 13 to the flexible conductor F12 of the connection object F1 without using any members other than the contacts 13, the reinforcement sheet 14, the top insulator 15 and the bottom insulator 16.

While the connector 11 has the four contacts 13 in Embodiment 1 above, it suffices if at least one contact 13 is provided, and the number of the contacts 13 is not limited to four.

While the connection object F1 has the first island-like portion 21 and the second island-like portion 31, for example, one or three or more island-like portions may be provided depending on the number of the contacts 13.

Further, while in Embodiment 1 above, the two connection parts 51A and 52A are disposed in the first island-like portion 21 of the connection object F1 and the two connection parts 53A and 54A are disposed also in the second island-like portion 31, only one connection part may be disposed in one island-like portion. In this case, it is also possible to connect a pair of wirings to one connection part, draw the pair of wirings out from the island-like portion through a pair of joint portions respectively joined to opposite ends of the island-like portion, and converge the pair of wirings to one wiring on a surrounding portion of the support. The pair of wirings are connected to one connection part of the island-like portion in this manner, whereby electric resistance of the wirings can be lowered and detection of microcurrent via the contact 13 can be performed with higher accuracy.

In addition, three or more connection parts may be disposed in one island-like portion. In this case, two or more wirings are disposed on at least one of a pair of joint portions respectively joined to opposite ends of the island-like portion, whereby wirings can be drawn from the three or more connection parts, respectively. When the joint portions are folded back to invert the island-like portion, in order to prevent short-circuit of the two or more wirings disposed on the joint portions, the joint portions are preferably folded back with the wirings being located outside and the support being located inside as shown in FIG. 21. When the joint portions are folded back with the wirings being located inside and the support being located outside as shown in FIG. 13, an insulating layer such as an insulating sheet is interposed between the joint portions to be folded back, whereby short-circuit of the two or more wirings disposed on the joint portions can be prevented.

While in Embodiment 1 above, the opposite end portions in the Y direction of the first island-like portion 21 of the connection object F1 are joined to a surrounding portion of the support F11 through the pair of joint portions 24 and 25, respectively, only one end portion in the Y direction of the first island-like portion 21 may be joined to a surrounding portion of the support F11 with the joint portion, without no joint portion at the other end portion in the Y direction of the first island-like portion 21. However, as in Embodiment 1, the configuration in which the joint portions 24 and 25 are respectively disposed at the opposite end portions in the Y direction of the first island-like portion 21 is preferred because this configuration makes it possible to stably invert the first island-like portion 21 around the inversion axis A1.

The same applies to the joint portions 34 and 35 of the second island-like portion 31.

Further, while in Embodiments 1, the connector 11 is attached to the connection object F1 together with the reinforcement sheet 14, the reinforcement sheet 14 may be omitted when it is not particularly necessary to reinforce the connection object F1.

Regardless of whether the flexible conductor F12 is exposed on the bottom surface or the top surface of the connection object F1, since the contacts 13 are separately disposed on the connection parts 51A, 52A, 53A and 54A as shown in FIG. 16, each of the connection parts 51A, 52A, 53A and 54A may be electrically connected to the corresponding contact 13 by, for example, soldering in place of inserting each of the connection parts 51A, 52A, 53A and 54A of the connection object F1 into the recessed portion 13C of the corresponding contact 13 by the projection 16B of the bottom insulator 16.

Embodiment 2

In Embodiment 1 above, the joint portions 24, 25, 34 and 35 joined to the first island-like portion 21 and the second island-like portion 31 of the connection object F1 extend in the X direction intersecting the inversion axes A1 and A2 and are respectively folded back at the folding-back lines 26, 27, 36 and 37 along the inversion axes A1 and A2, whereby the first island-like portion 21 and the second island-like portion 31 are respectively inverted by 180° around the inversion axes A1 and A2, but the invention is not limited thereto.

Figure 25:
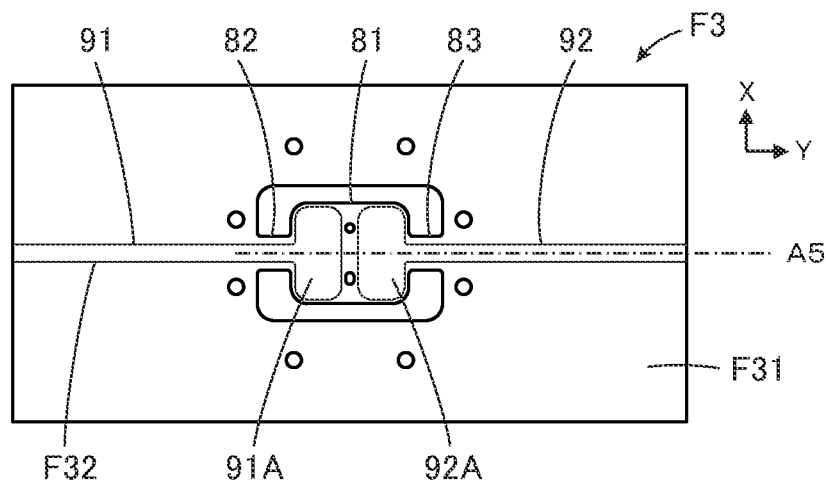
FIG. 25 is a bottom view showing a bottom surface of a connection object used in a connector assembly according to Embodiment 2.
Figure 26:
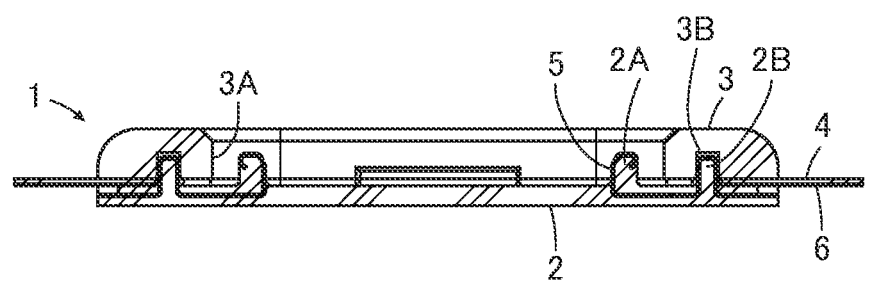
FIG. 26 is a cross-sectional view showing a conventional connector.
Figure 27:
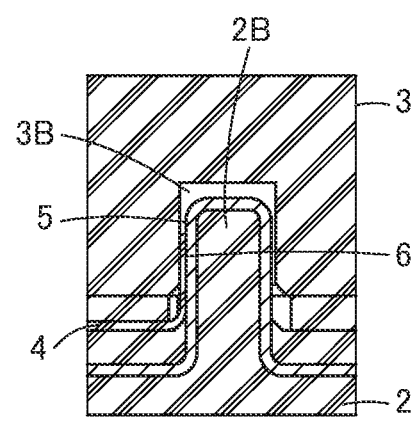
FIG. 27 is an enlarged view of an important part of FIG. 26.

For example, in a connection object F3 shown in FIG. 25, opposite end portions in the Y direction of an island-like portion 81 formed in a support F31 are joined to a surrounding portion of the support F31 through a pair of joint portions 82 and 83 extending in the Y direction, respectively. On a bottom surface of the support F31 facing in the −Z direction, two wirings 91 and 92 constituted of a flexible conductor F32 are exposed, and in the island-like portion 81, a connection part 91A formed of part of the flexible conductor F32 and connected to an end portion of the wiring 91 and a connection part 92A formed of part of the flexible conductor F32 and connected to an end portion of the wiring 92 are arranged side by side in the Y direction on and along an inversion axis A5.

The pair of joint portions 82 and 83 both extend in a straight line along the inversion axis A5, and when these joint portions 82 and 83 are twisted by 180° around the inversion axis A5, the island-like portion 81 provided with the connection parts 91A and 92A can be inverted by 180° around the inversion axis A5.

While the connection parts 91A and 92A of the island-like portion 81 are disposed on the inversion axis A5 and there is a difference as to whether the connection parts 91A and 92A face the bottom surface side or the top surface side of the connection object F3 before and after the island-like portion 81 is inverted by 180° around the inversion axis A5, when viewed from the Z direction perpendicular to the connection object F3, the connection parts 91A and 92A are retained at substantially the same predetermined positions with respect to the connection object F3.

Therefore, even when the connection object F3 above is used, as with the connector assembly of Embodiment 1, irrespective of whether the flexible conductor F32 is exposed on the bottom surface or the top surface of the connection object F3, only by selecting whether the island-like portion 81 of the connection object F3 is inverted by 180° around the inversion axis A5 or not inverted and kept as it is, the connector 11 can be attached to the connection object F3 to electrically connect the contacts 13 to the flexible conductor F32 of the connection object F3 without using any members other than the contacts 13, the reinforcement sheet 14, the top insulator 15 and the bottom insulator 16 that are described in Embodiment 1.

What is claimed is:

1. A connecting method for electrically connecting a contact having conductivity to a flexible conductor exposed on one of surfaces of a connection object, the flexible conductor including a connection part that is formed of part of the flexible conductor and situated at a predetermined position when viewed from a direction perpendicular to the connection object,
   wherein the connection object includes a support having a sheet-like shape and insulation properties, and the flexible conductor is disposed on one of surfaces of the support,
   wherein the support includes an island-like portion that is surrounded by a pair of cuts facing each other and is provided at one surface thereof with at least one connection part, and a pair of joint portions that respectively join opposite ends of the island-like portion to a surrounding portion of the support,
   the method comprising the steps of:
   when the flexible conductor is exposed on a top surface of the connection object, disposing the contact on the top surface of the connection object at the predetermined position in a state where the connection object is kept as it is, and when the flexible conductor is exposed on a bottom surface of the connection object, disposing the contact on the top surface of the connection object at the predetermined position in a state where a part of the connection object where the connection part is disposed is inverted such that the connection part faces a top surface side of the connection object while being retained at the predetermined position, wherein when the pair of joint portions are deformed, the island-like portion is inverted around an inversion axis extending along the support, and
   retaining the contact in a housing that is attached to the connection object and bringing the contact into contact with the connection part to electrically connect the contact to the flexible conductor.

2. The connecting method according to claim 1,
   wherein the contact includes a tubular portion,
   wherein the housing has a projection corresponding to the tubular portion of the contact, and
   wherein when the contact is retained in the housing, the connection part of the flexible conductor is pushed into the tubular portion of the contact by the projection, whereby the contact is electrically connected to the flexible conductor.

3. A connector assembly comprising:
   a connection object having a flexible conductor exposed on one of surfaces of the connection object; and
   a connector that is attached to the connection object,
   wherein the connector includes
   a contact that is disposed on a top surface of the connection object and has conductivity, and
   a housing that is attached to the connection object and retains the contact,
   wherein the flexible conductor includes a connection part that is formed of part of the flexible conductor and situated at a predetermined position when viewed from a direction perpendicular to the connection object,
   wherein the connection object includes a support having a sheet-like shape and insulation properties, and the flexible conductor is disposed on one of surfaces of the support,
   wherein the support includes an island-like portion that is surrounded by a pair of cuts facing each other and is provided at one surface thereof with at least one connection part, and a pair of joint portions that respectively join opposite ends of the island-like portion to a surrounding portion of the support,
   wherein when the flexible conductor is exposed on a top surface of the connection object, the contact is disposed on the top surface of the connection object at the predetermined position in a state where the connection object is kept as it is, and when the flexible conductor is exposed on a bottom surface of the connection object, the contact is disposed on the top surface of the connection object at the predetermined position in a state where a part of the connection object where the connection part is disposed is inverted such that the connection part faces a top surface side of the connection object while being retained at the predetermined position, wherein when the pair of joint portions are deformed, the island-like portion is inverted around an inversion axis extending along the support, and wherein the contact retained in the housing makes contact with the connection part, whereby the contact is electrically connected to the flexible conductor.

4. The connector assembly according to claim 3,
wherein the pair of joint portions extend in a direction intersecting the inversion axis, and
wherein when the pair of joint portions are folded back along a folding-back line disposed on the inversion axis, the island-like portion is inverted by 180° around the inversion axis.

5. The connector assembly according to claim 3,
wherein the pair of joint portions extend in a straight line parallel to the inversion axis, and
wherein when the pair of joint portions are twisted by 180° around the inversion axis, the island-like portion is inverted around the inversion axis.

6. The connector assembly according to claim 3, wherein the connection part is disposed on the inversion axis.

7. The connector assembly according to claim 6,
wherein the island-like portion is provided with two connection parts along the inversion axis, and
wherein the flexible conductor separately connected to a corresponding one of the two connection parts is disposed on each of the pair of joint portions.

8. The connector assembly according to claim 3,
wherein the housing is constituted of a top insulator disposed on a top surface side of the connection object, and a bottom insulator disposed on a bottom surface side of the connection object, and
wherein the connection object is sandwiched between the top insulator and the bottom insulator, whereby the contact is retained in the housing.

9. The connector assembly according to claim 8,
wherein the contact has a tubular portion and a flange that is formed at one end of the tubular portion,
wherein the top insulator includes a contact through-hole that is penetrated by the tubular portion of the contact and is smaller than the flange, and
wherein the top insulator is fixed to the bottom insulator with the flexible conductor being sandwiched therebetween such that the tubular portion of the contact is passed through the contact through-hole and the flange of the contact is pressed against the top surface of the flexible conductor, whereby the contact is retained in the housing.

10. The connector assembly according to claim 9,
wherein the bottom insulator has a projection corresponding to the tubular portion of the contact, and
wherein when the contact is retained in the housing, the connection part of the flexible conductor is pushed into the tubular portion of the contact by the projection, whereby the contact is electrically connected to the flexible conductor.

* * * * *